(12) United States Patent
Fromm et al.

(10) Patent No.: US 7,250,238 B2
(45) Date of Patent: Jul. 31, 2007

(54) TONERS AND PROCESSES THEREOF

(75) Inventors: Mary C. Fromm, Rochester, NY (US);
Michelle M. Bruzee, Rochester, NY (US); Grazyna E. Kmiecik-Lawrynowicz, Fairport, NY (US); Pinyen Lin, Rochester, NY (US); Chieh-Min Cheng, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 152 days.

(21) Appl. No.: 10/745,214

(22) Filed: Dec. 23, 2003

(65) Prior Publication Data

US 2005/0137278 A1  Jun. 23, 2005

(51) Int. Cl.
*C08F 2/50* (2006.01)
*G03G 9/08* (2006.01)
*C08L 25/14* (2006.01)

(52) U.S. Cl. .................. 430/56; 522/117; 522/116; 522/42; 522/44; 522/39; 522/64; 522/95; 522/18; 427/510; 430/130

(58) Field of Classification Search ......... 430/137.14, 430/56, 130; 522/117, 121, 18, 39, 42, 44, 522/64, 116
See application file for complete search history.

(56) References Cited

U.S. PATENT DOCUMENTS

| 4,107,013 A * | 8/1978 | McGinniss et al. ......... 524/524 |
| 4,465,755 A * | 8/1984 | Kiritani et al. .......... 430/110.2 |
| 5,278,020 A | 1/1994 | Grushkin et al. |
| 5,290,654 A | 3/1994 | Sacripante et al. |
| 5,308,734 A | 5/1994 | Sacripante et al. |
| 5,310,812 A * | 5/1994 | Yasuda et al. ............. 525/309 |
| 5,344,738 A | 9/1994 | Kmiecik-Lawrynowicz et al. |
| 5,346,797 A | 9/1994 | Kmiecik-Lawrynowicz et al. |
| 5,348,832 A | 9/1994 | Sacripante et al. |
| 5,364,729 A | 11/1994 | Kmiecik-Lawrynowicz et al. |
| 5,366,841 A | 11/1994 | Patel et al. |
| 5,369,139 A * | 11/1994 | Boeckeler et al. ............ 522/21 |
| 5,370,963 A | 12/1994 | Patel et al. |
| 5,403,693 A | 4/1995 | Patel et al. |
| 5,405,728 A | 4/1995 | Hopper et al. |
| 5,418,108 A | 5/1995 | Kmiecik-Lawrynowicz et al. |
| 5,482,812 A | 1/1996 | Hopper et al. |
| 5,496,676 A | 3/1996 | Croucher et al. |
| 5,501,935 A | 3/1996 | Patel et al. |
| 5,527,658 A | 6/1996 | Hopper et al. |
| 5,585,215 A | 12/1996 | Ong et al. |
| 5,622,806 A | 4/1997 | Veregin et al. |
| 5,650,255 A | 7/1997 | Ng et al. |
| 5,650,256 A | 7/1997 | Veregin et al. |
| 5,723,253 A | 3/1998 | Higashimo et al. |
| 5,744,520 A | 4/1998 | Kmiecik-Lawrynowicz et al. |
| 5,747,215 A | 5/1998 | Ong et al. |
| 5,763,133 A | 6/1998 | Ong et al. |
| 5,766,818 A | 6/1998 | Smith et al. |
| 5,804,349 A | 9/1998 | Ong et al. |
| 5,827,633 A | 10/1998 | Ong et al. |
| 5,840,462 A | 11/1998 | Foucher et al. |

(Continued)

*Primary Examiner*—Susan Berman
(74) *Attorney, Agent, or Firm*—Eugene O. Palazzo; Fay Sharpe LLP

(57) ABSTRACT

Disclosed are toner compositions comprised of a polymer, an optional colorant, and an UV light curable oligomer. Also disclosed are methods for producing a UV curable toner compositions, the toner compositions produced thereby, and methods of utilizing the UV curable toner compositions in various painting applications.

21 Claims, 2 Drawing Sheets

U.S. PATENT DOCUMENTS

| | | |
|---|---|---|
| 5,853,944 A | 12/1998 | Foucher et al. |
| 5,863,698 A | 1/1999 | Patel et al. |
| 5,869,215 A | 2/1999 | Ong et al. |
| 5,902,710 A | 5/1999 | Ong et al. |
| 5,905,012 A * | 5/1999 | De Meutter et al. ...... 430/124.1 |
| 5,910,387 A | 6/1999 | Mychajlowskij et al. |
| 5,916,725 A | 6/1999 | Patel et al. |
| 5,919,595 A | 7/1999 | Mychajlowskij et al. |
| 5,922,501 A | 7/1999 | Cheng et al. |
| 5,925,488 A | 7/1999 | Patel et al. |
| 5,928,830 A * | 7/1999 | Cheng et al. ........... 430/137.12 |
| 5,945,245 A | 8/1999 | Mychajlowskij et al. |
| 5,977,210 A | 11/1999 | Patel et al. |
| 6,083,618 A * | 7/2000 | Causton et al. .............. 428/327 |
| 6,258,504 B1 * | 7/2001 | Bartus et al. ........... 430/137.17 |
| 6,350,792 B1 * | 2/2002 | Smetana et al. ............... 522/81 |
| 6,447,974 B1 * | 9/2002 | Chen et al. ............ 430/137.14 |
| 6,500,597 B1 * | 12/2002 | Patel et al. ............ 430/137.14 |
| 6,503,680 B1 * | 1/2003 | Chen et al. ............ 430/137.14 |

* cited by examiner

TONERS AND PROCESSES THEREOF

BACKGROUND

Disclosed herein are UV curable toner compositions and processes thereof. In the embodiments disclosed, the toner compositions provided herein can be selected for use in graphic arts and packaging applications, such as more specifically, temperature sensitive packaging and foil seals.

A current trend in the printing industry is xerographic packaging applications. Such applications generally utilize heat fused toners. However, there are a number of problems associated with using heat fused toners in these applications. One problem relates to printing on temperature sensitive packaging or substrates. It would be desirable to provide a toner composition that is fusible without significant heating or heating at high temperatures.

Additionally, printing for a number of packaging applications can require the use of materials that are durable and which are resistant to a variety of conditions and environmental factors. Conventional package printing uses curable inks to "toughen" the resulting printed image or indicia such that the image or indicia on the final packaging is durable and wear-resistant. In addition, many offset printings use a heated overcoat to protect the image from abrasion. However, overcoats applied to fused and unfused images can cause degradation of image quality. Accordingly, there is a need for a toner composition that in embodiments may not require a protective overcoat.

Furthermore, in the graphic arts industry and for a number of other entities, printing is performed on a wide array of substrates and surfaces such as on yogurt containers, foil seals for containers and other diverse packaging configurations. There can be a number of disadvantages associated with using heat fused xerographic toners in these traditionally lithographic printing applications. Many lithographic applications use an overcoat that is subsequently heated to protect images from abrasion. However, applying overcoats to fused and unfused toner can disturb the toner piles. Overcoats are usually applied with heat and this heat causes dry toners to smear and possibly undergo phase separation that can damage image quality. Accordingly, there is also a need for a single application printing process that can avoid the need for an overcoat, and particularly can avoid a multi-step process which includes a step of applying and heating an overcoat.

BRIEF DESCRIPTION

Disclosed herein is a method for providing a UV curable toner composition and the toner composition produced thereby. Also disclosed are methods of utilizing the UV curable toner compositions in printing processes to overcome one or more of the difficulties noted above.

Also disclosed herein are various toner emulsion aggregation processes that permit the generation of toners that in embodiments can be cured, that is by the exposure to UV radiation, such as UV light of has about 100 nm to about 400 nm. In the embodiments disclosed, the toner compositions produced can be utilized in various printing applications such as temperature sensitive packaging and the production of foil seals.

Aspects disclosed herein in the embodiments relate to a UV curable toner composition comprised of an optional colorant, an optional wax, a polymer generated from styrene, and acrylate selected from the group consisting of butyl acrylate, carboxyethyl acrylate, and a UV light curable acrylate oligomer.

Additionally, these aspects relate to a toner composition comprised of a colorant such as a pigment, an optional wax, and a polymer generated from a UV curable cycloaliphatic epoxide.

Furthermore, these aspects relate to a method of forming a UV curable toner composition. The method comprises preparing a latex of a polymer formed from styrene, butyl acrylate, 2-carboxymethyl acrylate, and a UV curable acrylate; combining the latex with an optional pigment and an optional wax to form a first system; adding flocculant to the first system to induce aggregation and form toner precursor particles dispersed in a second system; heating the toner precursor particles to a temperature greater than the glass transition temperature of the polymer to form toner particles; washing the toner particles; and optionally washing and then drying the toner particles.

Moreover, these aspects relate to a method of forming a UV curable toner composition comprising mixing a latex containing a polymer formed from styrene, butyl acrylate, a carboxymethyl acrylate, and a UV curable acrylate with a colorant and wax; adding flocculant to this mixture to optionally induce aggregation and form toner precursor particles dispersed in a second mixture; heating the toner precursor particles to a temperature equal to or higher than the glass transition temperature ($T_g$) of the polymer to form toner particles; optionally washing the toner particles; and optionally drying the toner particles. A further aspect relates to the toner particles produced by this method.

These aspects also relate to a method of forming a UV curable toner composition, the method comprising mixing a latex of a polymer formed from styrene, butyl acrylate, and carboxymethyl acrylate, with pigment and wax to form a first system; adding flocculant to the first system to induce aggregation and form toner precursor particles dispersed in a second system; adding a UV curable acrylate to the second system to form a shell on the toner precursor particles; heating the toner precursor particles to a temperature greater than the glass transition temperature $T_g$ of the shell to form toner particles; and, optionally washing and drying the toner particles. The resulting toner particles produced by this method are also included herein.

One advantage of the present exemplary embodiment is the provision of a UV curable toner composition that does not require an overcoat subsequently applied onto the toner.

Another advantage of the present exemplary embodiment is the provision of a toner composition that does not require heat for fusing. This composition will find wide applications in printing of temperature sensitive packaging or substrates.

Still further advantages and benefits of the present exemplary embodiment will become apparent to those of ordinary skill in the art upon reading and understanding the following detailed description of the preferred embodiments.

BRIEF DESCRIPTION OF THE DRAWINGS

The exemplary embodiment may take form in various components and arrangements of components, and in various steps and arrangements of steps. The drawings are only for purposes of illustrating preferred embodiments and are not to be construed as limiting the exemplary embodiment.

DETAILED DESCRIPTION

Figure 1:
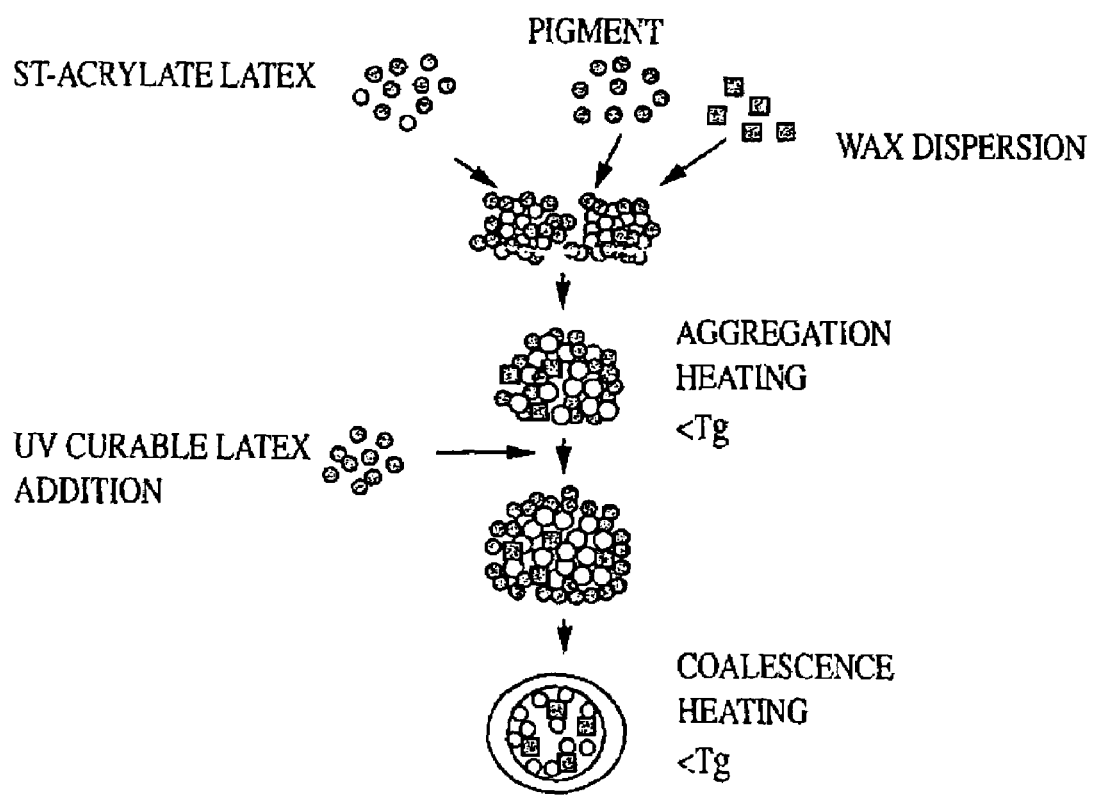
FIG. 1 is a schematic flow chart depicting a process for forming a preferred embodiment emulsion aggregation particles.

Emulsion aggregation toners are provided that are curable upon exposure to ultraviolet light. These toners are generally referred to herein as "UV curable EA toners." As will be appreciated by those skilled in the art, the designation "EA" refers to emulsion aggregation. And "UV" refers to ultraviolet light, that is light having a wavelength of from about 100 nm to about 400 nm. The toners described herein can be obtained by incorporating into the toner particles during their formation, acrylate oligomers containing ethylenically unsaturated sites. UV curing of the resulting toner composition is then utilized to create very durable and wear resistant images for packaging and other applications. A UV-active EA latex incorporating styrene-butyl acrylate-2-carboxyethyl acrylate-polyurethane oligomer is also provided. Additionally, a UV curable lacquer is incorporated into EA toner particles in the aggregation process in order to enable post-fusing UV curing of the toner. This strategy provides the functionality of a lacquer coating in a one-step process. This is important for packaging applications to improve image durability.

The toner compositions comprise a polymer based upon a copolymer resin of styrene and an arylate. In one embodiment, the acrylate may be selected from he group consisting of butyl acrylate, carboxyethyl acrylate, and combinations thereof. The preferred toner compositions are based upon copolymer resins of styrene, butyl acrylate, and 2-carboxyethyl acrylate. A 2-carboxyethyl acrylate-containing resin may be used and is ideal for further crosslinking after printing via UV light radiation. The EA toners described herein are ideal for packaging printing because of the versatile resin design and toner morphology.

It is instructive to consider EA technology. For example, emulsion/aggregation/coalescing processes for the preparation of toners are illustrated in a number of patents, the disclosures of which are totally incorporated herein by reference, such as U.S. Pat. No. 5,290,654, U.S. Pat. No. 5,278,020, U.S. Pat. No. 5,308,734, U.S. Pat. No. 5,370,963, U.S. Pat. No. 5,344,738, U.S. Pat. No. 5,403,693, U.S. Pat. No. 5,418,108, U.S. Pat. No. 5,364,729, and U.S. Pat. No. 5,346,797; and also of interest may be U.S. Pat. Nos. 5,348,832; 5,405,728; 5,366,841; 5,482,812; 5,496,676; 5,527,658; 5,585,215; 5,622,806; 5,650,255; 5,650,256 and 5,501,935; 5,723,253; 5,744,520; 5,763,133; 5,766,818; 5,747,215; 5,827,633; 5,853,944; 5,804,349; 5,840,462; 5,869,215; 5,863,698; 5,902,710; 5,910,387; 5,916,725; 5,919,595; 5,922,501; 5,925,488; 5,945,245; and 5,977,210. The components and processes of the patents can be selected for the present development and embodiments thereof.

More specifically, the present development provides an EA toner comprising styrene, butyl acrylate, 2-carboxyethyl acrylate, and UV light curable acrylate oligomer. The composition optionally also includes an effective amount of a photoinitiator, which upon being exposed to ultraviolet light, causes the EA toner to substantially immediately polymerize. The UV light curable acrylate oligomer is present in the EA toner composition in an amount of from 1 to about 15 percent by weight, and preferably in an amount of from about 2 to about 10 percent by weight. When a photoinitiator is employed in the EA toner composition, it is generally used in an amount of from about 0.1 to about 5 weight percent of the EA toner, and preferably from about 0.5 to about 2 percent by weight Any suitable UV light curable acrylate oligomeric material that is compatible with the monomers of (i) styrene, (ii) butyl acrylate, and 2-carboxyethyl acrylate can be employed so long as the oligomer contains ethylenically unsaturated sites that will react with the unsaturated groups present in the monomers (i) and (ii) set forth above. Suitable materials include end-capped acrylate moieties present on such oligomers as epoxy-acrylates, polyester-acrylates, acrylate oligomers, polyether acrylates, polyether-urethane acrylates, polyester-urethane acrylates, and the like. Polyurethanes, end-capped with acrylate moieties such as hydroxyethyl acrylate are preferred. Further, the polyurethane oligomer can be prepared utilizing an aliphatic diisocyanate such as hexamethylene diisocyanate, cyclohexane diisocyanate, diisocyclohexylmethane diisocyanate, isophorone diisocyanate, and the like. Isophorone diisocyanate can be used. Another example is a polyester polyurethane prepared from adipic acid and neopentyl glycol. The polyester together with a further quantity of neopentyl glycol is reacted with an excess of isophorone diisocyanate and then the isocyanate groups on the terminal portion of the molecule are reacted with hydroxyl ethyl acrylate. An example of a suitable material is one sold under the grade designation CN966-H90 by Sartomer Company.

Table 1 illustrate several examples of UV curable acrylate copolymers from Sartomer Company. After curing by exposure to UV light, the copolymers are toughened and provide excellent gloss and water resistance, which is one of the important requirements for most packaging applications. In contrast, conventional EA toner is very sensitive to water and relative humidity.

TABLE 1

Examples of UV Curable Acrylate Copolymers

|  | Oligomer | Backbone | MW M = 1,000 | Viscosity (cps) @ 60° C. |
|---|---|---|---|---|
| Group I | CN964 | Ester | 1.6-1.8M | 21,000 |
|  | CN966 | Ester | 5.4-5.6M | 70,000 |
| Group II | CN981 | Ester/Ether | — | 10,000 |
|  | CN982 | Ester/Ether | 1.6-1.8M | 9,375 |
| Group III | CN986 | Ether | 1.6-1.8M | 450 |
|  | Pro1154 | Ether | 5.4-5.6M | 26,500 |
|  | CN301 | Butadiene | — | 4,175 |

Representative properties for several of these UV curable acrylates are set forth below in Tables 2-4. CN964 is an aliphatic polyester based urethane diacrylate oligomer. CN981 is an aliphatic polyester/polyether based urethane diacrylate oligomer. CN301 is a polybutadiene dimethyacrylate.

TABLE 2

CN964
TYPICAL PHYSICAL AND CHEMICAL PROPERTIES

| Appearance | Clear liquid |
|---|---|
| Color, APHA | 30 |
| Density, lbs./gal. | 9.185 |
| Elongation, % | 49 |
| Functionality | 2 |
| Modulus, psi. @ % | 7679 |
| Molecular Weight | 3710 |

TABLE 2-continued

CN964
TYPICAL PHYSICAL AND CHEMICAL PROPERTIES

| | |
|---|---|
| Refractive index 25' | 1.4848 |
| Tensile Strength, psi. | 1001 |
| $T_g$, ° C. | −24 |
| Viscosity @ 60'c cps | 17,675 |

TABLE 3

CN-981
TYPICAL PHYSICAL AND CHEMICAL PROPERTIES

| | |
|---|---|
| Functionality | 2 |
| Appearance | Clear liquid |
| Inhibitor, ppm. | <400 MEHQ |
| Color, APHA (G = Gardner scale) | 65 |
| Density, lbs./gal. | 9.308 |
| Viscosity, cps. | 6190 @ 60° C. |
| Refractive Index | 1.4908 |
| $T_g$, ° C. | 22 |
| Tensile Strength, psi. | 1113 |
| Elongation, % | 81 |
| Modulus, psi. @ 1% | 6385 |

TABLE 4

CN301
TYPICAL PHYSICAL AND CHEMICAL PROPERTIES

| | |
|---|---|
| Acid value, mg koh/g | <5 |
| Color, APHA | 9G |
| Density, lbs./gal. | 8.045 |
| Elongation | 25 |
| Functionality | 2 |
| Refractive index 25' | 1.5072 |
| Tensile Strength, psi. | 505 |
| $T_g$, C. | −75 |
| Viscosity, cps. @ 40° C. | 890 @ 60° C. |

Additional examples of commercially available UV curable monomers that can be used in the embodiments herein, include but are not limited to, tris (2-hydroxy ethyl) isocyanurate triacrylate (SR 368 Sartomer) from Atofina; ethoxylated pentaerythritol tetraacrylate (Sartomer SR 494) from Atofina; pentaerythritol tetracrylate (Sartomer SR 295); dipentaerythritol pantaacrylate (Sartomer SR 399); chlorinated polyester acrylate (Sartomer CN 2100) from Atofina; amine modified epoxy acrylate (Sartomer CN 2100); aromatic urethane acrylate (Sartomer CN 2901); polyurethane acrylate laromer LR 8949 from BASF; aromatic urethane triacrylate CN 970 from Atofina; aliphatic diacrylate oligomer CN 132 from Atofina; aliphatic urethane diacrylate CN 981 from Atofina; and aromatic urethane diacrylate CN976 from Atofina.

Suitable photoinitiators may be employed in the toner compositions described herein such as 2-hydroxy-2-methyl-1-phenyl-1-propanone available from Ciba-Geigy under the grade designation Darocur 1173; 1-hydroxycyclohexylphenyl ketone; 2-benzyl-2-dimethylamino-1-(4-morpholinophenyl)-butan-1-one; 2,2-dimethoxy-2-phenylacetophe morpholinyl)-1-propanone available from Ciba-Geigy under the grade designation Irgacure® 184, 369, 651, and 907 respectively.

Additional examples of commercially available photoinitiators from Ciba-Specialty Chemicals, include, but are not limited to, 2-hydroxy-2-methyl-1-phenyl-propan-1-one (HMPP)—Darocure 1173; 2,4,6-trimethyl benzoyl diphenyl phosphine oxide (TPO)—Darocure 4265; 50-50 Blend of HMPP and TPO; 2-methyl-1 [4-(methylthio)phenyl]-2-morpholino propan-1one (MMMP)—Irgacure 907; and 2,2-dimethoxy-2-phenyl acetophenone (BDK)—Irgacure 651. Examples of commercially available photoinitiators from BASF, include, but are not limited to, 2,4,6-trimethyl benzoyl diphenyl phosphine oxide (Lucirin TPO); alpha hydroxyketone; and 2-hydroxy-2-methyl-phenyl-1-propane.

Also provided is a UV-active EA latex incorporating styrene-butyl acrylate-2-carboxyethyl acrylate-polyurethane oligomer. EA styrene-butyl acrylate-2-carboxyethyl acrylate-polyurethane oligomer latex can be prepared via a semi-continuous emulsion polymerization process. FIG. 1 illustrates a process for forming EA toner. The UV curable latex is readily incorporated into the process. The UV curable latex can be added at the beginning of the aggregation process, i.e. prior to aggregation of the toner particles, or it can be introduced as the "shell" latex in the middle of the aggregation stage. UV curable EA toner particles are formed by making a physical mixture of latex, pigment, wax, photoinitiator, and/or silica at the primary particle size, and initiating aggregation with a cationic flocculant. Following the coalescence step at a temperature higher than the resin glass transition temperature ($T_g$), the resulting particles are washed and dried.

More specifically, a process for forming the UV curable EA toner described herein can involve combining styrene, butyl acrylate, and 2-carboxyethyl acrylate with pigment and wax. As previously noted, the UV curable acrylate oligomer may be added at this point in the process or later in the process, i.e. at the beginning of the aggregation step to form a shell. After a suitable mixture or dispersion is formed, aggregation is initiated by addition of a cationic flocculant. This is generally followed by mixing and heating operations. The resulting system and toner particles are then heated to a temperature that is greater than the $T_g$ of the polymer or shell component of the toner. The resulting particles are then washed. One or more suitable drying operations are then performed on the toner particles.

A typical UV light curing process for the embodiment EA toners is as follows. After the fusing step, the EA toner image is exposed to a cure unit such as a Linde PS-2000 UV system, with UV lamps generating 2×400 watts/in.² The cure rates can be from about 10 to about 300 feet per minute on a typical substrate.

A significant advantage of employing UV light curing of EA toners is that the post-crosslinking may be performed by utilizing the chemical functional group incorporated in the EA toner resin.

When utilizing the EA toner compositions described herein on packaging that is heat treated or otherwise subjected to a heating operation, i.e. food packaging, it is important that the images on the printed packaging not be altered by the application of heat. That is, the deposited toner should not flow under heat once fused to the substrate. A strategy for preventing fused toner flow involves exposure of the toner composition to UV radiation to thereby cause crosslinking of the toner resin.

The embodiment UV curable toner compositions have numerous applications. The various compositions described herein enable better fusing of toners on rough stock. Many xerographic toners exhibit difficulty with fusing on thick or rough papers. It is difficult to transfer the heat of a heat-roll fuser system through heavy and textured papers, and even more difficult to transfer the heat to the very high surface area of color images. Additionally, the embodiments may be used in conjunction with a wide variety of existing technologies. For example, a conventional printing operation may provide a tough and durable image or indicia by utilizing the EA toner and curing by subsequent exposure to UV light. A heat-roll fuser is utilized to initially fuse the printed image or indicia. That operation is followed by exposure to a low temperature, UV cure unit that can initiate the UV curing of a fused EA toner image. The curing operation helps bond the image to itself and the paper, and thereby improves the copy quality metrics of crease and rub. Further, UV cured images will perform better in recirculating document handlers. UV curable toner will further promote consumer satisfaction.

In another aspect, a UV curable lacquer component is incorporated into an EA particle. As will be understood by those skilled in the art, a lacquer coating is a coating formulated with an acrylic resin that dries to provide a solid, protective film. The term "UV curable lacquer component" refers to any UV curable acrylic resin.

Figure 2:
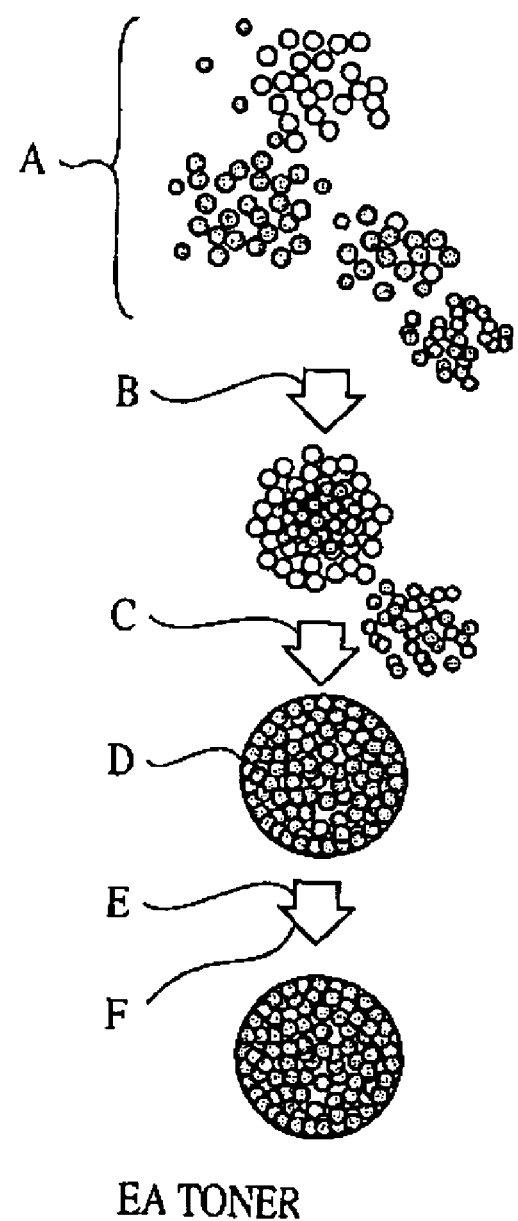
FIG. 2 is a schematic flow chart illustrating another process of forming preferred embodiment emulsion aggregation particles.

The styrene acrylate EA particles are formed by making a physical mixture of anionic components (latex, pigment, wax, silica, etc.) at their primary particle size, and initiating aggregation with a cationic flocculant. In a styrene acrylate system, a shell of latex is added to the aggregated particle during the coalescence step. This process is depicted in FIG. 2. Referring to FIG. 2, that figure illustrates a process including steps A through F for forming EA toner. Step A is a homogenization step for blending the various components. These components include a latex which, for example, may be a styrene-butyl acrylate, 2-carboxyethyl acrylate copolymer for fusing and charging control. Additionally, another component added during Step A includes the desired pigments. Furthermore, the components in Step A may include wax and also internal colloidal silica. Step B is an aggregation step in which the particles are formed to a desired size. A flocculant such as polyaluminum chloride may be used. Mixing and heating operations are typically employed in Step B. Step C is the shell addition step in which pigment is retained inside the resulting particle. Effective amounts of sodium hydroxide may be added for particle stabilization. In Step D, a coalescence operation occurs. This assists in melting the latex to control particle shape and also control surface properties. Generally mixing and heating are performed during Step D. Nitric acid may be added to assist in shape and surface control. In Step E, a washing operation is performed to remove surfactants. Additional sodium hydroxide may be added for removal of surfactants. And additional nitric acid may be added for base neutralization. In Step F, a drying operation is performed. This serves to control moisture and pH.

In accordance with this methodology, a strategy is to incorporate a UV curable resin as the lacquer component, as a shell to the EA particle, where a photoinitiator is included in the body of the particle. Due to its cationic nature, this photoinitiator could be used as a flocculant in the aggregation process.

It will be appreciated that the toner embodiments described herein include toner particles in which the UV curable component is located within specific regions of a toner particle. For example, an EA toner is provided in which the UV curable resin and photoinitiator is incorporated into the shell. An EA toner is also provided in which the UV curable component is incorporated into the toner core, while the other component(s) are incorporated into the toner shell. An EA toner is provided in which the UV curable components are blended on the surface of the toner as external additives. And, an EA toner is provided in which one UV curable component is incorporated into the interior of the toner while one or more additional UV curable components are blended on the surface of the toner.

Furthermore, it will be understood that the various emulsion aggregation processes described herein include embodiments that involve mixing polymeric resin, UV curable component and optionally pigment, wax and photoinitiator and aggregating them to form UV curable EA toner. The embodiments also involve dispersing a UV curable component along with toner latex prior to the aggregation process and then aggregating the resulting system to form toner particles. Additionally, the embodiments involve dispersing both the UV curable component and photoinitiator along with latex prior to the aggregation process such that they are aggregated together with other toner components such as pigment, wax, etc. Moreover, the embodiments involve preparation of the previously noted toner in which the aggregation is performed with or without UV curable materials (UV curable resin and optionally photoinitiator) and the UV curable resin and optionally photoinitiator are added with the shell, or as the shell, after the aggregation and before the coalescence. And, the embodiments involve adding the UV curable component and potentially the photoinitiator as powders during the additive blending process.

The mechanism for the lacquer curing process is a two phase process. In a first step, i.e. the fusing step, the shell resin is crushed and allowed to come into physical contact with the photoinitiator material. After the fusing step, the image is exposed to a Cure Unit such as the previously noted Linde PS-2000, with UV lamps producing 2×400 watts/inch$^2$. The cure rates of the proposed resin-photoinitiator system would be about 300 to about 500 feet per minute on a typical substrate.

Preferred UV curable resins for use as the lacquer component in the embodiment systems include, but are not limited to, UV cycloaliphatic epoxides. Representative cycloaliphatic epoxides include, but are not limited to 3,4-epoxycyclohexylmethyl-3,4-epoxycyclohexane carboxylate and bis-(3,4-3poxycyclohexyl) adipate. An example of a commercially available system is Cyracure®, which is currently available from Union Carbide Corporation. Cyracure® is a low viscosity epoxide resin, which is used in conjunction with a Cyracure® photoinitiator, which is a cationic salt such as mixed triarylsulfonium hexafluoroantimonate salts or mixed triarylsulfonium hexafluorophosphate salts. This cationic UV curable lacquer formulation has shown excellent results in the type of applications generally associated with EA toner compositions. The cationic UV curable lacquer formulation functions as an overprint varnish (OPV) on both tin-free steel and aluminum for rigid packaging, and as a paper coating and as a plastic substrate coating. The cured lacquers provide retortable and pasteurizable films exhibiting noteworthy adhesion, flexibility and protective properties.

Representative components of the Cyracure® system include, but are not limited to those set forth in Table 5, below.

TABLE 5

Representative Components of the Cyracure ® System

| CYRACURE ® Products | Description | Function |
|---|---|---|
| Resins | | |
| UVR-6105 | Low-viscosity base epoxide resin | Contributes primary film properties |
| UVR-6110 | Base epoxides resin | Contributes primary film properties |
| UVR-6128 | Flexible epoxides resin | Contributes primary film properties |
| Diluents | | |
| UVR-6000 | Oxetane dilutent | Viscosity reducer |
| UVR-6100 | Cycloaliphatic epoxides diluent | Viscosity reducer |
| UVR-6216 | Linear aliphatic | Viscosity reducer |

TABLE 5-continued

Representative Components of the Cyracure ® System

CYRACURE ®

| Products | Description | Function |
|---|---|---|
| | diluent | |
| Photoinitiators | | |
| UVI-6976 | Aryl sulfonium salt | For fastest cure speeds and/or thick or pigmented films |
| UVI-6992 | Aryl sulfonium salt | For most thin films (<1 mil) applications |

The chemical structures of the resins and photoinitiators in Table 5 are as follows:

UVR-6105 and UVR-6110

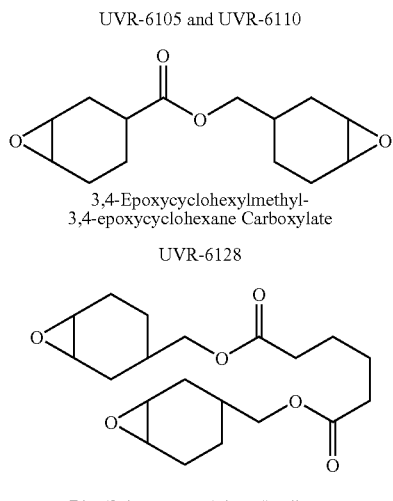

3,4-Epoxycyclohexylmethyl-
3,4-epoxycyclohexane Carboxylate

UVR-6128

Bix-(3,4-epoxycyclohexyl)Adipate

UVI-6976

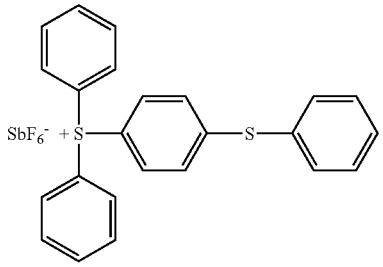

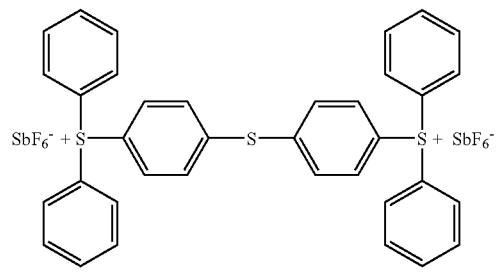

Mixed Triarylsulfonium Hexafluoroantimonate Salts
UVI-6992

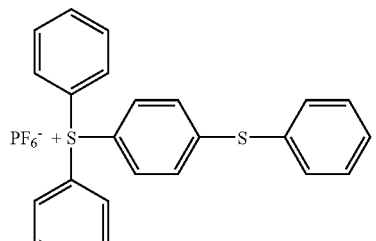

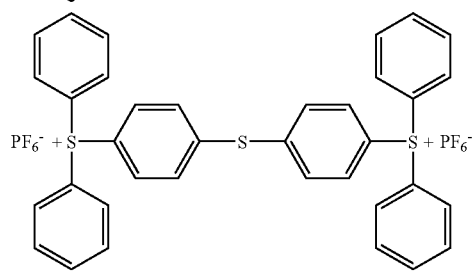

Mixed Triarylsulfonium Hexafluorophosphate Salts

Tables 6, 7, and 8 describe typical properties of the Cyracure® resins, diluents, and photoinitiators:

TABLE 6

Typical Properties of Cyracure ® Resins

| Product | UVR-6105 | UVR-6110 | UVR-6128 |
|---|---|---|---|
| Chemical Name | 3,4 Epoxycyclohexylmethyl-3,4-Epoxycyclohexane Carboxylate | 3,4-Epoxycyclohexylmethyl 3,4-Epoxycyclohexane Carboxylate- | Bis-(3,4-epoxycyclohexyl) Adipate |
| Epoxide Equivalent Weight | 130-135 | 131-143 | 190-210 |
| Viscosity at 25° C., cP | 220-250 | 350-450 | 550-750 |
| Specific Gravity at 20/20° C. | 1.16 | 1.173 | 1.149 |

TABLE 6-continued

Typical Properties of Cyracure ® Resins

| Product | UVR-6105 | UVR-6110 | UVR-6128 |
|---|---|---|---|
| Vapor Pressure at 20° C., mm Hg | <0.01 | Nil | Nil |
| Color, Pt-Co | <50 | <100 | <100 |
| Primary Irritation Index | | | |
| Skin, Draize Value (0-8) | 1.6 | 1.35 | 0.25 |
| Eye, Draize Value (0-110) | 8.0 | 7.5 | 4.0 |

TABLE 7

Typical Properties of Cyracure ® Diluents

| Product | UVR-6000 | UVR-6216 | UVR-6100 |
|---|---|---|---|
| Chemical Name | 3-Ethyl-3-hydroxy-methyl-oxetane | 1,2-Epoxy-hexadecane | Mixed cycloaliphatic epoxides |
| Equivalent Weight | c. 116 | 240-280 | 130-140 |
| Viscosity at 25° C., cP | c. 22 | <15 | 85-115 |
| Specific Gravity at 20/20° | 1.04 | 0.844 | 1.1395 |
| Vapor Pressure at 20° C., mm Hg | — | <0.01 | 0.59 |
| Color, Pt-Co | — | <50 | <100 |
| Primary Irritation Index | | | |
| Skin, Draize Value (0-8) | — | 3.8 | 0.9 |
| Eye, Draize Value (0-110) | — | 4.0 | 1.0 |

TABLE 8

Typical Properties of Cyracure ® Photoinitiators

| Product | UVR-6976 | UVR-6992 |
|---|---|---|
| Chemical Name | Mixed Triarylsulfonium Hexafluoroantimonate Salts | Mixed Triarylsulfonium Hexafluorophosphate Salts |
| Description | Cationic Photoinitiator Antimonate Salt Faster curing than UVI-6992 | Cationic Photoinitiator Phosphate Salt |
| Viscosity at 25° C., cP | 75 | 75 |
| Specific Gravity at 25/25° | 1.39 | 1.32 |
| Vapor Pressure at 20° C., mm Hg | <0.03 | <0.03 |
| Color, Gardner Scale | 5 | 5 |

It will be appreciated that the properties of the Cyracure® may be adjusted as desired. For example, if greater flexibility of the resulting composition is desired, various polyols available under the designation Cyracure® Tone® may be added to the composition prior to curing.

UV curable lacquer and toner compositions provide numerous benefits for a wide array of applications. UV curable lacquers enable better fusing, i.e. improved durability and wear resistance, of toners on rough stock. All xerographic toners struggle with fusing on thick or rough papers. It is difficult to transfer the heat of a heat-roll fuser system through heavy and textured papers, much less the very high area coverage of color images. A low viscosity epoxy can flow to the paper and improve the quality and overall aesthetics of crease and rub. Further, UV cured images will perform better in recirculating document handlers. UV curable toner can be a significant customer satisfier.

The various embodiment toner compositions can be applied on a wide array of substrates. For example, the substrate may be paper, cardboard, plastic, foil, metal, and combinations thereof.

Printing and/or coating processes can use the various embodiment toner compositions. Generally, a substrate as previously noted is provided. A toner composition is also provided. Generally, the toner composition is one including a polymer generated from styrene and acrylate selected from the group consisting of butyl acrylate, carboxyethyl acrylate, and a UV light curable acrylate oligomer and optionally a colorant. Alternately, the toner composition can be one that includes a polymer generated from a UV curable cycloaliphatic epoxide and a colorant. The toner composition is applied onto the substrate using known coating or printing techniques. The toner composition is then cured by exposure to UV light.

Several trials were conducted to evaluate the characteristics of a UV curable toner composition as described herein. Specifically, three EA toner compositions were prepared. These were yellow EA toners prepared with UV curable resins in an emulsion polymerization step, then aggregated with pigment and wax to form UV curable EA toners. These UV curable monomers/oligomers in EA latex preparation were: (1) polyesterurethane acrylate; (2) dimethyl m-isopropenyl benzyl isocyanate; and (3) trimethylolpropane triacrylate. The yellow EA toners were evaluated by forming images in a MajectiK 5765 copier in Xerox 4024 paper, and fusing the image using an Imari-MF free belt nip fuser. After the fusing step, the EA toner images were exposed to a UV curing system, with an energy of about 14 joule/cm$^2$, and light wavelength of about 150 to 375 nm. The radiation temperature was maintained between 25 to 30° C. The post-cured EA toner images demonstrated excellent rub resistance. The images resisted 40 double rubs with a toluene laden cloth.

Additional examples of polymer latex synthesis and toner particle preparation are as follows.

POLYMER LATEX SYNTHESIS

Latex Example (I). Poly(styrene-butyl acrylate-acrylic acid-β-carboxyethyl acrylate) Polymer Latex A polymer latex (EP406) comprised of a styrene/n-butyl acrylate/β-carboxyethyl acrylate copolymer of 74:23:3 prepared with 1.7 pph dodecanethiol (chain transfer agent), 0.35 pph branching agent (A-DOD, decanediol diacrylate, available from Shin-Najamura Co., Japan) and 1.5 percent of ammonium persulfate initiator was synthesized by a semicontinuous emulsion polymerization process using the anionic surfactant DOWFAX 2A1™ (sodium tetrapropyl diphenoxide disulfonate, 47 percent active, available from Dow Chemical).

In a 3 gallon jacketed stainless steel reactor with double flight impellers (a four pitched-blade impeller each) set at 35 rpm, 3.87 kilograms of deionized water with 5.21 grams of DOWFAX 2A1™ (7 percent of the total surfactant) were charged while the temperature was raised from room, about 23 to about 25° C. to 75° C. A monomer emulsion was prepared by mixing a monomer mixture (3108 grams of styrene, 966 grams of n-butyl acrylate, 122 grams of 2-carboxyethyl acrylate (β-CEA)), 14.3 grams of A-DOD and 45 grams of 1-dodecanethiol with 1930 grams of deionized water and 80.7 grams of DOWFAX 2A1™ (93 percent of the total surfactant) at room temperature for 30 minutes in a 1.5 gallon Pope tank. 63 grams of the seed were pumped from the monomer emulsion into a 0.2 gallon beaker and subsequently the seed was charged into the reactor at 75° C. An initiator solution prepared from 61 grams of ammonium persulfate in 302 grams of deionized water was added over 20 minutes after the seed emulsion addition. The reactor was stirred at 48 rpm for an additional 20 minutes to allow seed particle formation at 75° C. The monomer emulsion was then fed into the reactor. Monomer emulsion feeding was stopped after 110 minutes and 24.9 grams of 1-dodecanethiol (DDT) were added to the remaining emulsion in the 1.5 gallon Pope tank which was mixed for a further 5 minutes before feeding resumed. The remaining monomer emulsion was fed into the reactor over 90 minutes. At the end of the monomer feed, the emulsion was post-heated at 75° C. for 180 minutes, then cooled to 25° C. The reaction system was deoxygenated by passing a stream of nitrogen through it during the reaction. A latex resin containing 42 weight percent styrene-butyl acrylate-β-carboxy ethylacrylate resin, 57 weight percent water, 0.4 weight percent anionic surfactant Dowfax 2A1™, 0.6 percent of an ammonium sulfate salt species was obtained. The resulting amorphous polymer poly(styrene-butyl acrylate-acrylic acid-β-carboxyethyl acrylate) possessed a weight-average molecular weight $M_w$ of 33,200, and a number-average molecular weight $M_n$ of 10,400, as determined on a Waters GPC, and a mid-point Tg of 50.7° C., as measured on a Seiko DSC. The latex resin or polymer possessed a volume average diameter of 222 nanometers as measured by light scattering technique on a Coulter N4 Plus Particle Sizer.

Latex Example (II). Poly(styrene-butyl acrylate-acrylic acid-β-carboxyethyl acrylate-urethane acrylate) Polymer Latex A polymer latex (EP432) comprised of a styrene/n-butyl acrylate/β-carboxyethyl acrylate/urethane acrylate copolymer of 70:19:3:8 prepared with 1.7 pph dodecanethiol (chain transfer agent), 0.35 pph branching agent (A-DOD, decanediol diacrylate) and 1.5 percent of ammonium persulfate initiator was synthesized by a semicontinuous emulsion polymerization process using the anionic surfactant DOWFAX 2A1™. The UV curable urethane acrylate oligomer is available from Sartomer Co. under the grade designation CN966-H90.

In a 3 gallon jacketed stainless steel reactor with double flight impellers (a four pitched-blade impeller each) set at 35 rpm, 3.87 kilograms of deionized water with 5.21 grams of DOWFAX 2A1™ (7 percent of the total surfactant) were charged while the temperature was raised from room, about 23 to about 25° C. to 75° C. A monomer emulsion was prepared by mixing a monomer mixture (2937 grams of styrene, 797 grams of n-butyl acrylate, 126 grams of 2-carboxyethyl acrylate (β-CEA)), 336 grams of urethane acrylate oligomer (CN966-H90), 16.8 grams of 2-hydroxy-2-methyl-1-phenyl-1-propane (photoinitiator, available from Ciba-Geigy under the grade designation Darocur 1173), 14.3 grams of A-DOD and 45 grams of 1-dodecanethiol with 1930 grams of deionized water and 80.7 grams of DOWFAX 2A1™ (93 percent of the total surfactant) at room temperature for 30 minutes in a 1.5 gallon Pope tank. 63 grams of the seed were pumped from the monomer emulsion into a 0.2 gallon beaker and subsequently the seed was charged into the reactor at 75° C. An initiator solution prepared from 61 grams of ammonium persulfate in 302 grams of deionized water was added over 20 minutes after the seed emulsion addition. The reactor was stirred at 48 rpm for an additional 20 minutes to allow seed particle formation at 75° C. The monomer emulsion was then fed into the reactor. Monomer emulsion feeding was stopped after 110 minutes and 24.9 grams of 1-dodecanethiol (DDT) were added to the remaining emulsion in the 1.5 gallon Pope tank which was mixed for a further 5 minutes before feeding resumed. The remaining monomer emulsion was fed into the reactor over 90 minutes. At the end of the monomer feed, the emulsion was post-heated at 75° C. for 180 minutes, then cooled to 25° C. The reaction system was deoxygenated by passing a stream of nitrogen through it during the reaction. A latex resin containing 42 weight percent styrene-butyl acrylate-β-carboxy ethylacrylate-urethane acrylate resin, 57 weight percent water, 0.4 weight percent anionic surfactant Dowfax 2A1™, 0.6 percent of an ammonium sulfate salt species was obtained. The resulting amorphous polymer poly(styrene-butyl acrylate-acrylic acid-β-carboxyethyl acrylate-urethane acrylate) possessed a weight-average molecular weight $M_w$ of 37,100, and a number-average molecular weight $M_n$ of 11,600, as determined on a Waters GPC, and a mid-point Tg of 51.2° C., as measured on a Seiko DSC. The latex resin or polymer possessed a volume average diameter of 241 nanometers as measured by light scattering technique on a Coulter N4 Plus Particle Sizer.

Latex Example (III). Poly(styrene-butyl acrylate-acrylic acid-β-carboxyethyl acrylate-dimethyl m-isopropenyl benzyl isocyanate) Polymer Latex A polymer latex (EP443) comprised of a styrene/n-butyl acrylate/β-carboxyethyl acrylate/dimethyl m-isopropenyl benzyl isocyanate copolymer of 71:20:3:6 prepared with 1.7 pph dodecanethiol (chain transfer agent), 0.35 pph branching agent (A-DOD, decanediol diacrylate) and 1.5 percent of ammonium persulfate initiator was synthesized by a semicontinuous emulsion polymerization process using the anionic surfactant DOWFAX 2A1™. UV curable dimethyl m-isopropenyl benzyl isocyanate is available from Cytec Industries under the trade name TMI.

In a 3 gallon jacketed stainless steel reactor with double flight impellers (a four pitched-blade impeller each) set at 35 rpm, 3.87 kilograms of deionized water with 5.21 grams of DOWFAX 2A1™ (7 percent of the total surfactant) were charged while the temperature was raised from room, about 23 to about 25° C. to 75° C. A monomer emulsion was prepared by mixing a monomer mixture (2979 grams of styrene, 839 grams of n-butyl acrylate, 126 grams of 2-carboxyethyl acrylate (β-CEA)), 252 grams of dimethyl m-isopropenyl benzyl isocyanate (TMI), 12.6 grams of 2-hydroxy-2-methyl-1-phenyl-1-propane (photoinitiator, available from Ciba-Geigy under the grade designation Darocur 1173), 14.3 grams of A-DOD and 45 grams of 1-dodecanethiol with 1930 grams of deionized water and 80.7 grams of DOWFAX 2A1™ (93 percent of the total surfactant) at room temperature for 30 minutes in a 1.5 gallon Pope tank. 63 grams of the seed were pumped from the monomer emulsion into a 0.2 gallon beaker and subsequently the seed was charged into the reactor at 75° C. An initiator solution prepared from 61 grams of ammonium persulfate in 302 grams of deionized water was added over 20 minutes after the seed emulsion addition. The reactor was stirred at 48 rpm for an additional 20 minutes to allow seed particle formation at 75° C. The monomer emulsion was then fed into the reactor. Monomer emulsion feeding was stopped after 110 minutes and 24.9 grams of 1-dodecanethiol (DDT) were added to the remaining emulsion in the 1.5 gallon Pope tank which was mixed for a further 5 minutes before feeding resumed. The remaining monomer emulsion was fed into the reactor over 90 minutes. At the end of the monomer feed, the emulsion was post-heated at 75° C. for 180 minutes, then cooled to 25° C. The reaction system was deoxygenated by passing a stream of nitrogen through it during the reaction. A latex resin containing 42 weight percent styrene-butyl acrylate-β-carboxy ethylacrylate-dimethyl m-isopropenyl benzyl isocyanate resin, 57 weight percent water, 0.4 weight percent anionic surfactant Dowfax 2A1™, 0.6 percent of an ammonium sulfate salt species was obtained. The resulting amorphous polymer poly(styrene-butyl acrylate-acrylic acid-β-carboxyethyl acrylate-dimethyl m-isopropenyl benzyl isocyanate) possessed a weight-average molecular weight $M_w$ of 35,500, and a number-average molecular weight $M_n$ of 10,900, as determined on a Waters GPC, and a mid-point Tg of 52.1° C., as measured on a Seiko DSC. The latex resin or polymer possessed a volume average diameter of 233 nanometers as measured by light scattering technique on a Coulter N4 Plus Particle Sizer.

Latex Example (IV). Poly(styrene-butyl acrylate-acrylic acid-β-carboxyethyl acrylate-trimethylolpropane triacrylate) Polymer Latex A polymer latex (EP444) comprised of a styrene/n-butyl acrylate/β-carboxyethyl acrylate/trimethylolpropane triacrylate copolymer of 71:20:3:6 prepared with 1.7 pph dodecanethiol (chain transfer agent), 0.35 pph branching agent (A-DOD, decanediol diacrylate) and 1.5 percent of ammonium persulfate initiator was synthesized by a semicontinuous emulsion polymerization process using the anionic surfactant DOWFAX 2A1™. UV curable trimethylolpropane triacrylate is available from Sartomer Co. under the trade name SR351.

In a 3 gallon jacketed stainless steel reactor with double flight impellers (a four pitched-blade impeller each) set at 35 rpm, 3.87 kilograms of deionized water with 5.21 grams of DOWFAX 2A1™ (7 percent of the total surfactant) were charged while the temperature was raised from room, about 23 to about 25° C. to 75° C. A monomer emulsion was prepared by mixing a monomer mixture (2979 grams of styrene, 839 grams of n-butyl acrylate, 126 grams of 2-carboxyethyl acrylate (β-CEA)), 252 grams of trimethylolpropane triacrylate (SR351), 12.6 grams of 2-hydroxy-2-methyl-1-phenyl-1-propane (photoinitiator, available from Ciba-Geigy under the grade designation Darocur 1173), 14.3 grams of A-DOD and 45 grams of 1-dodecanethiol with 1930 grams of deionized water and 80.7 grams of DOWFAX 2A1™ (93 percent of the total surfactant) at room temperature for 30 minutes in a 1.5 gallon Pope tank. 63 Grams of the seed were pumped from the monomer emulsion into a 0.2 gallon beaker and subsequently the seed was charged into the reactor at 75° C. An initiator solution prepared from 61 grams of ammonium persulfate in 302 grams of deionized water was added over 20 minutes after the seed emulsion addition. The reactor was stirred at 48 rpm for an additional 20 minutes to allow seed particle formation at 75° C. The monomer emulsion was then fed into the reactor. Monomer emulsion feeding was stopped after 110 minutes and 24.9 grams of 1-dodecanethiol (DDT) were added to the remaining emulsion in the 1.5 gallon Pope tank which was mixed for a further 5 minutes before feeding resumed. The remaining monomer emulsion was fed into the reactor over 90 minutes. At the end of the monomer feed, the emulsion was post-heated at 75° C. for 180 minutes, then cooled to 25° C. The reaction system was deoxygenated by passing a stream of nitrogen through it during the reaction. A latex resin containing 42 weight percent styrene-butyl acrylate-β-carboxy ethylacrylate-trimethylolpropane triacrylate resin, 57 weight percent water, 0.4 weight percent anionic surfactant Dowfax 2A1™, 0.6 percent of an ammonium sulfate salt species was obtained. The resulting amorphous polymer poly(styrene-butyl acrylate-acrylic acid-β-carboxyethyl acrylate-trimethylolpropane triacrylate) possessed a weight-average molecular weight $M_w$ of 35,500, and a number-average molecular weight $M_n$ of 10,900, as determined on a Waters GPC, and a mid-point Tg of 52.1° C., as measured on a Seiko DSC. The latex resin or polymer possessed a volume average diameter of 233 nanometers as measured by light scattering technique on a Coulter N4 Plus Particle Sizer.

TONER PARTICLE PREPARATION

EXAMPLE I 5.6 Micron Yellow Toner Particles Generated by PAC A/C Process

The poly(styrene-butyl acrylate-acrylic acid-β-carboxyethyl acrylate-urethane acrylate) polymer latex of Latex Example (II) (EP432) above was utilized in an aggregation/coalescence (A/C) process to produce 5.6 micron (volume average diameter) particles with a narrow size distribution.

500 grams of deionized water was placed in a stainless steel beaker and homogenized at 5,000 rpm, while there was added 300 grams of latex poly(styrene-butyl acrylate-acrylic acid-β-carboxyethyl acrylate-urethane acrylate) (EP432), 37.16 grams of the polyethylene wax POLYWAX 725® dispersion (Mw of 725, 31 percent active, available from Baker-Petrolite Company) followed by the addition of 38.3 grams of PY74 yllow pigment dispersion (17 percent active, available from Sun Chemicals) diluted with 110 grams of deionized water. To the resulting homogenized latex/pigment blend, 2.4 grams of 10 percent PAC (polyaluminum chloride obtained from Asada Company of Japan) solution diluted with 24 grams of 0.02N $HNO_3$ was added dropwise to cause a flocculation of the PY74 yellow pigment, 6 percent by weight, the POLYWAX 725®, 9 percent by weight, the resin, 84.88 weight percent, and 0.12 weight percent of the PAC. After the addition was complete, homogenization was continued for an additional 2 minutes to form a creamy blend with an average particle size by volume of 2.68 and with a GSDv of 1.21. The creamy blend was then transferred into a 2 liter glass reactor and stirred at 350 rpm, while being heated to about 52° C. to about 53° C. Particle growth was monitored during heating. When the particle size diameter of the solids by volume was equal to 5.44 (GSDv=1.20), the pH of the slurry was adjusted. The slurry was comprised of about 16 weight percent of toner and of about 84 weight percent of water. The toner was comprised of about 6 percent of PY74 yellow pigment, about 9 percent of POLYWAX 725®, about 0.2 weight percent of PAC and about 84.8 percent by weight of the resin poly(styrene-butyl acrylate-acrylic acid-β-carboxyethyl acrylate-urethane acrylate), and wherein the total amount of the toner components was about 100 percent. The pH was adjusted to 7.5 by the addition of a 2 percent NaOH solution and the speed in the reactor was reduced to 200 rpm. After ½ hour of stirring at 53° C., the temperature in the reactor was increased to 95° C. After 1 hour of heating at 95° C., the pH of the slurry was adjusted to 4.3 and the heating was continued for an additional 5 hours. Thereafter, the reactor contents were cooled down to about room temperature, throughout the Examples, about 23° C. to about 25° C. and were discharged. A 16 percent solids slurry of 5.62 micron black toner particles with GSDv=1.19 was obtained. The resulting toner product was comprised of about 6 percent of PY74 yellow pigment, about 9 percent of POLYWAX 725®, about 0.2 weight percent of PAC and about 84.8 percent by weight of the resin poly(styrene-butyl acrylate-acrylic acid-β-carboxyethyl acrylate-urethane acrylate), and wherein the total amount of the toner components was about 100 percent. The toner particles were then washed with deionized water five times and dried.

EXAMPLE II 5.6 Micron Y llow Toner Particl s Generated by PAC A/C Proc ss

The poly(styrene-butyl acrylate-acrylic acid-β-carboxyethyl acrylate) polymer latex of Latex Example (I) (EP406) and poly(styrene-butyl acrylate-acrylic acid-β-carboxyethyl acrylate-dimethyl m-isopropenyl benzyl isocyanate) polymer latex of Latex Example (III) (EP443) above were utilized in an aggregation/coalescence (A/C) process to produce 5.6 micron (volume average diameter) particles with a narrow size distribution.

500 grams of deionized water was placed in a stainless steel beaker and homogenized at 5,000 rpm, while there was added 200 grams of polymer latex poly(styrene-butyl acrylate-acrylic acid-β-carboxyethyl acrylate) (EP406), 37.16 grams of the polyethylene wax POLYWAX 725® dispersion followed by the addition of 38.3 grams of PY74 yellow pigment dispersion (17 percent active, available from Sun Chemicals) diluted with 110 grams of deionized water. To the resulting homogenized latex/pigment blend, 2.4 grams of 10 percent PAC (polyaluminum chloride) solution diluted with 24 grams of 0.02N HNO$_3$ was added dropwise to cause a flocculation of the PY74 yellow pigment, 8.37 percent by weight, the POLYWAX 725®, 12.55 percent by weight, the resin poly(styrene-butyl acrylate-acrylic acid-β-carboxyethyl acrylate), 78.91 weight percent, and 0.17 weight percent of the PAC. After the addition was complete, homogenization was continued for an additional 2 minutes to form a creamy blend with an average particle size by volume of 2.68 and with a GSDv of 1.21. The creamy blend was then transferred into a 2 liter glass reactor and stirred at 350 rpm, while being heated to about 52° C. to about 53° C. Particle growth was monitored during heating. When the particle size diameter of the solids by volume was equal to 4.84 (GSDv=1.21), 100 grams of polymer latex poly(styrene-butyl acrylate-acrylic acid-β-carboxyethyl acrylate-dimethyl m-isopropenyl benzyl isocyanate) (EP443) was added into the slurry mixture in the glass reactor. Particle growth was continuously monitored during heating. When the particle size diameter of the solids by volume was equal to 5.43 (GSDv=1.22), the pH of the slurry was adjusted. The slurry was comprised of about 16 weight percent of toner and of about 84 weight percent of water. The toner was comprised of about 6 percent of PY74 yellow pigment, about 9 percent of POLYWAX 725®, about 0.2 weight percent of PAC, about 56.5 percent by weight of the resin poly(styrene-butyl acrylate-acrylic acid-β-carboxyethyl acrylate-urethane acrylate), and about 28.3 percent by weight of resin poly(styrene-butyl acrylate-acrylic acid-β-carboxyethyl acrylate-dimethyl m-isopropenyl benzyl isocyanate). The total amount of the toner components was about 100 percent. The pH was adjusted to 7.5 by the addition of a 2 percent NaOH solution and the speed in the reactor was reduced to 200 rpm. After ½ hour of stirring at 53° C., the temperature in the reactor was increased to 95° C. After 1 hour of heating at 95° C., the pH of the slurry was adjusted to 4.3 and the heating was continued for an additional 5 hours. Thereafter, the reactor contents were cooled down to about room temperature, throughout the Examples, about 23° C. to about 25° C. and were discharged. A 16 percent solids slurry of 5.65 micron black toner particles with GSDv=1.22 was obtained. The resulting toner product was comprised of about 6 percent of PY74 yellow pigment, about 9 percent of POLYWAX 725®, about 0.2 weight percent of PAC, about 56.5 percent by weight of the resin poly(styrene-butyl acrylate-acrylic acid-β-carboxyethyl acrylate), and about 28.3 percent by weight of the resin poly(styrene-butyl acrylate-acrylic acid-β-carboxyethyl acrylate-dimethyl m-isopropenyl benzyl isocyanate), and wherein the total amount of the toner components was about 100 percent. The toner particles were then washed with deionized water five times and dried.

EXAMPLE III 5.6 Micron Yellow Toner Particles Generated by PAC A/C Process

The poly(styrene-butyl acrylate-acrylic acid-β-carboxyethyl acrylate) polymer latex of Latex Example (I) (EP406) and poly(styrene-butyl acrylate-acrylic acid-β-carboxyethyl acrylate-trimethylolpropane triacrylate) polymer latex of Latex Example (IV) (EP444) above were utilized in an aggregation/coalescence (A/C) process to produce 5.6 micron (volume average diameter) particles with a narrow size distribution.

500 grams of deionized water was placed in a stainless steel beaker and homogenized at 5,000 rpm, while there was added 200 grams of polymer latex poly(styrene-butyl acrylate-acrylic acid-β-carboxyethyl acrylate) (EP406), 37.16 grams of the polyethylene wax POLYWAX 725® dispersion followed by the addition of 38.3 grams of PY74 yellow pigment dispersion (17 percent active, available from Sun Chemicals) diluted with 110 grams of deionized water. To the resulting homogenized latex/pigment blend, 2.4 grams of 10 percent PAC (polyaluminum chloride) solution diluted with 24 grams of 0.02N HNO$_3$ was added dropwise to cause a flocculation of the PY74 yellow pigment, 8.37 percent by weight, the POLYWAX 725®, 12.55 percent by weight, the resin poly(styrene-butyl acrylate-acrylic acid-β-carboxyethyl acrylate), 78.91 weight percent, and 0.17 weight percent of the PAC. After the addition was complete, homogenization was continued for an additional 2 minutes to form a creamy blend with an average particle size by volume of 2.59 and with a GSDv of 1.21. The creamy blend was then transferred into a 2 liter glass reactor and stirred at 350 rpm, while being heated to about 52° C. to about 53° C. Particle growth was monitored during heating. When the particle size diameter of the solids by volume was equal to 4.79 (GSDv=1.20), 100 grams of polymer latex poly(styrene-butyl acrylate-acrylic acid-β-carboxyethyl acrylate-trimethylolpropane triacrylate) (EP444) was added into the slurry mixture in the glass reactor. Particle growth was continuously monitored during heating. When the particle size diameter of the solids by volume was equal to 5.49 (GSDv=1.22), the pH of the slurry was adjusted. The slurry was comprised of about 16 weight percent of toner and of about 84 weight percent of water. The toner was comprised of about 6 percent of PY74 yellow pigment, about 9 percent of POLYWAX 725®, about 0.2 weight percent of PAC, about 56.5 percent by weight of the resin poly(styrene-butyl acrylate-acrylic acid-β-carboxyethyl acrylate-urethane acrylate), and about 28.3 percent by weight of resin poly(styrene-butyl acrylate-acrylic acid-β-carboxyethyl acrylate-trimethylolpropane triacrylate). The total amount of the toner components was about 100 percent. The pH was adjusted to 7.5 by the addition of a 2 percent NaOH solution and the speed in the reactor was reduced to 200 rpm. After ½ hour of stirring at 53° C., the temperature in the reactor was increased to 95° C. After 1 hour of heating at 95° C., the pH of the slurry was adjusted to 4.3 and the heating was continued for an additional 5 hours. Thereafter, the reactor contents were cooled down to about room temperature, throughout the Examples, about 23° C. to about 25° C. and were discharged. A 16 percent solids slurry of 5.57 micron black toner particles with GSDv=1.21 was obtained. The resulting toner product was comprised of about 6 percent of PY74 yellow pigment, about 9 percent of POLYWAX 725®, about 0.2 weight percent of PAC, about 56.5 percent by weight of the resin poly(styrene-butyl acrylate-acrylic acid-β-carboxyethyl acrylate), and about 28.3 percent by weight of the resin poly(styrene-butyl acrylate-acrylic acid-β-carboxyethyl acrylate-trimethylolpropane triacrylate), and wherein the total amount of the toner components was about 100 percent. The toner particles were then washed with deionized water five times and dried.

COMPARATIVE EXAMPLE I 5.6 Micron Yellow Toner Particles Generated by PAC A/C Process The poly(styrene-butyl acrylate-acrylic acid-β-carboxyethyl acrylate) polymer latex of Latex Example (I) (EP406) above was utilized in an aggregation/coalescence (A/C) process to produce 5.6 micron (volume average diameter) particles with a narrow size distribution.

500 grams of deionized water was placed in a stainless steel beaker and homogenized at 5,000 rpm, while there was added 300 grams of latex poly(styrene-butyl acrylate-acrylic acid-β-carboxyethyl acrylate) (EP406), 37.16 grams of the polyethylene wax POLYWAX 725® dispersion (Mw of 725, 31 percent active, available from Baker-Petrolite Company) followed by the addition of 38.3 grams of PY74 yellow pigment dispersion (17 percent active, available from Sun Chemicals) diluted with 110 grams of deionized water. To the resulting homogenized latex/pigment blend, 2.4 grams of 10 percent PAC (polyaluminum chloride obtained from Asada Company of Japan) solution diluted with 24 grams of 0.02N $HNO_3$ was added dropwise to cause a flocculation of the PY74 yellow pigment, 6 percent by weight, the POLYWAX 725®, 9 percent by weight, the resin, 84.88 weight percent, and 0.12 weight percent of the PAC. After the addition was complete, homogenization was continued for an additional 2 minutes to form a creamy blend with an average particle size by volume of 2.63 and with a GSDv of 1.20. The creamy blend was then transferred into a 2 liter glass reactor and stirred at 350 rpm, while being heated to about 52° C. to about 53° C. Particle growth was monitored during heating. When the particle size diameter of the solids by volume was equal to 5.54 (GSDv=1.21), the pH of the slurry was adjusted. The slurry was comprised of about 16 weight percent of toner and of about 84 weight percent of water. The toner was comprised of about 6 percent of PY74 yellow pigment, about 9 percent of POLYWAX 725®, about 0.2 weight percent of PAC and about 84.8 percent by weight of the resin poly(styrene-butyl acrylate-acrylic acid-β-carboxyethyl acrylate). The total amount of the toner components was about 100 percent. The pH was adjusted to 7.5 by the addition of a 2 percent NaOH solution and the speed in the reactor was reduced to 200 rpm. After ½ hour of stirring at 53° C., the temperature in the reactor was increased to 95° C. After 1 hour of heating at 95° C., the pH of the slurry was adjusted to 4.3 and the heating was continued for an additional 5 hours. Thereafter, the reactor contents were cooled down to about room temperature, throughout the Examples, about 23° C. to about 25° C. and were discharged. A 16 percent solids slurry of 5.64 micron black toner particles with GSDv=1.21 was obtained. The resulting toner product was comprised of about 6 percent of PY74 yellow pigment, about 9 percent of POLYWAX 725®, about 0.2 weight percent of PAC and about 84.8 percent by weight of the resin poly(styrene-butyl acrylate-acrylic acid-β-carboxyethyl acrylate), and wherein the total amount of the toner components was about 100 percent. The toner particles were then washed with deionized water five times and dried.

EVALUATION

Yellow toners of the above Examples I to III and Comparative Example I were evaluated by forming images in a MajestiK 5765 copier in both Xerox 4024 paper and Xerox 3R3108 transparency, and fusing the images using Imari-MF free belt nip fuser. After the fusing step, the yellow toner images of Examples I to III and Comparative Example I demonstrated poor rub resistance. All the images were smeared after 10 double rubs with toluene laden cloth.

Yellow toners of the above Examples I to III and Comparative Example I were evaluated by forming images in a MajestiK 5765 copier in both Xerox 4024 paper and Xerox 3R3108 transparency, and fusing the images using Imari-MF free belt nip fuser. After the fusing step, these yellow toner images were exposed to a UV curing system (Loctite Zeta 7400 UV Oven by Loctite Corporation), with UV lamps of about 30 $mW/cm^2$ at the wavelength 365 nm. The exposure time is set at about 3 minutes. The radiation temperature was maintained between 25 to 30° C. The post-cured yellow toner images of Examples I to III demonstrated excellent rub resistance. The images resisted 20 double rubs with toluene-damped cloth. In contrast, the yellow toner images of Comparative Example I demonstrated poor rub resistance. The yellow toner images of Comparative Example I were smeared after 5 double rubs with toluene-damped cloth.

Images on polymer substrates and packaging cardboard were performed on bench development setup and fusing fixture. The above-mentioned developer made for MajectiK 5765 copier was incorporated into an electrostatographic imaging device with a cascade development zone. The substrates used for the development were brown paper cardboard and a few different polymer substrates such as polyethylene terephthalate (PET), high-density polyethylene (HDPE), polypropylene (PP), and Nylon®. After about 1.4 gm/cm$^2$ solid density was developed, the substrate and the toner were fused using a silicone rubber fuser roll from a Xerox 5028 machine. The surface temperature of fuser roll was set at about 400° F. and the speed was set at about 120 rpm. After the fusing step, these yellow toner images were exposed to a UV curing system and the rubbing tests were performed as mentioned above. All images made from toner in Examples I to III on polymer substrates and packaging cardboards resisted 20 double rubs with toluene-damped cloth, which showed improvement in solvent resistance after UV curing compared to non-UV curable toner images made from Comparative Example I. Polyethylene and polypropylene films showed equivalent development as PET films as the substrates. PE and PP films are excellent substrates for toner fused below 120° C.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A UV curable toner composition comprising a toner particle;
   wherein the toner particle comprises a core and a shell surrounding the core;
   wherein the core comprises (i) an optional colorant and (ii) a polymer generated from styrene and an acrylate monomer and
   wherein the shell comprises a UV curable acrylate oligomer, the UV curable acrylate oligomer comprising a polyurethane acrylate.

2. The toner composition of claim 1 wherein said UV light curable acrylate oligomer is present in said toner composition in an amount of from about 1 to about 15 percent by weight of the toner composition.

3. The toner composition of claim 1 wherein said UV light curable acrylate oligomer is present in said toner composition in an amount of from about 2 to about 10 weight percent of the toner composition.

4. The toner composition of claim 1 wherein said polyurethane acrylate is selected from the group consisting of polyether-urethane acrylate, polyester-urethane acrylate, and combinations thereof.

5. The toner composition of claim 4 wherein said polyurethane acrylate is polyester-urethane prepared from adipic acid and neopentyl glycol.

6. The toner composition of claim 1 wherein said polyurethane acrylate is a polyurethane end capped with an acrylate moiety.

7. The toner composition of claim 6 wherein said acrylate moiety is derived from hydroxyethyl acrylate.

8. The toner composition of claim 1 wherein said polyurethane acrylate is formed from a polyurethane oligomer.

9. The toner composition of claim 8 wherein said polyurethane oligomer is prepared from an aliphatic diisocyanate.

10. The toner composition of claim 9 wherein said aliphatic diisocyanate is selected from the group consisting of hexamethylene diisocyanate, cyclohexane diisocyanate, diisocyclohexylmethane diisocyanate, isophorone diisocyanate, and combinations thereof.

11. The toner composition of claim 10 wherein said aliphatic diisocyanate is isophorone diisocyanate.

12. The toner composition of claim 1 further comprising a photoinitiator located in the core or the shell.

13. The toner composition of claim 12 wherein said photoinitiator is present in said toner composition in an amount of from about 0.1 to about 5 percent by weight.

14. The toner composition of claim 13 wherein said photoinitiator is present in said toner composition in an amount of from about 0.5 to about 2 percent by weight.

15. The toner composition of claim 12 wherein said photoinitiator is selected from the group consisting of 2-hydroxy-2-methyl-1-phenyl-1-propanone; 1-hydroxycyclohexylphenyl ketone; 2-benzyl-2-dimethylamino-1-(4-morpholinophenyl) -butan-1-one; 2,2-dimethoxy-2-phenylacetophenone; 2-methyl-1-[4-(methylthio)phenyl]-2-(4-morpholinyl)-1-propanone; and combinations thereof.

16. The toner composition of claim 12 wherein said photoinitiator is selected from the group consisting of 2-hydroxy-2-methyl-1-phenyl-propan-1-one (HMPP); 2,4,6-trimethyl benzoyl diphenyl phosphine oxide (TPO); 50:50 Blend of HMPP and TPO; 2-methyl-1 [4-(methylthio)phenyl]-2-morpholino propan-1one (MMMP); 2,2-dimethoxy-2-phenyl acetophenone (BDK); 2,4,6-trimethyl benzoyl diphenyl phosphine oxide (Lucirin TPO); alpha hydroxyketone; and combinations thereof.

17. The toner composition of claim 12, wherein said photoinitiator is present in the core.

18. The toner composition of claim 12, wherein said photoinitiator is present in the shell.

19. The toner composition of claim 1 wherein said acrylate monomer is selected from the group consisting of butyl acrylate, carboxyethyl acrylate, and combinations thereof.

20. A method for printing and/or coating of a substrate, using at least one curable coating, said method comprising:
   providing a substrate;
   providing a toner composition including a toner particle, the toner particle comprising a core and a shell surrounding the core, the core comprising (i) a polymer generated from (a) styrene and (b) an acrylate selected from the group consisting of butyl acrylate, carboxyethyl acrylate, and combinations thereof, and (ii) an optional colorant, and the shell comprising (iii) a UV light curable acrylate oligomer, the UV light curable acrylate oligomer comprising a polyurethane acrylate;
   applying said toner composition on said substrate; and
   curing said toner composition by exposure to UV light.

21. The method of claim 20 wherein said substrate is selected from the group consisting of paper, cardboard, plastic, foil, metal, and combinations thereof.

* * * * *